US005520851A

United States Patent [19]

Yu et al.

[11] Patent Number: 5,520,851
[45] Date of Patent: May 28, 1996

[54] IRIDIUM OXIDE FILM FOR ELECTROCHROMIC DEVICE

[75] Inventors: Phillip C. Yu, Pittsburgh; David L. Backfisch, Monroeville, both of Pa.; Nada A. O'Brien; Bryant P. Hichwa, both of Santa Rosa, Calif.

[73] Assignee: PPG Industries, Inc., Pittsburgh, Pa.

[21] Appl. No.: 337,783

[22] Filed: Nov. 14, 1994

Related U.S. Application Data

[63] Continuation-in-part of Ser. No. 267,724, Jun. 28, 1994, which is a continuation-in-part of Ser. No. 152,339, Nov. 12, 1993, abandoned.

[51] Int. Cl.$^6$ .............................. H01B 1/00; H01B 1/06; H01B 1/08
[52] U.S. Cl. ..................... 252/518; 106/1.28; 420/461; 423/22; 428/357; 204/157.46
[58] Field of Search ................... 252/518; 106/1.28; 420/461; 423/22; 428/357; 204/157.46

[56] References Cited

U.S. PATENT DOCUMENTS

| | | | |
|---|---|---|---|
| 3,973,829 | 8/1976 | Giglia | 350/160 R |
| 4,174,152 | 11/1979 | Giglia et al. | 350/357 |
| 4,258,984 | 3/1981 | Beni et al. | 350/357 |
| 4,335,938 | 6/1982 | Giglia et al. | 350/357 |
| 4,340,278 | 7/1982 | Geni et al. | 350/357 |
| 4,350,414 | 9/1982 | Takashashi et al. | 350/357 |
| 4,361,385 | 11/1982 | Huang et al. | 350/357 |
| 4,459,035 | 7/1984 | Nanya et al. | 368/241 |
| 4,478,991 | 10/1984 | Huang et al. | 526/287 |
| 4,482,216 | 11/1984 | Hashimoto et al. | 350/357 |
| 4,554,318 | 11/1985 | Rukavina | 525/118 |
| 4,609,703 | 9/1986 | Rukavina | 524/360 |
| 4,652,090 | 3/1987 | Uchikawa | 350/357 |
| 4,670,334 | 6/1987 | Fujiwara et al. | 428/336 |
| 4,670,350 | 6/1987 | Rukavina | 428/520 |
| 4,715,691 | 12/1987 | Sata et al. | 350/357 |
| 5,011,582 | 4/1991 | Oshikawa et al. | 204/140 |
| 5,030,331 | 7/1991 | Sato | 204/38.3 |
| 5,180,524 | 1/1993 | Casilli et al. | 252/586 |
| 5,181,142 | 1/1993 | Asai et al. | 359/581 |
| 5,244,557 | 9/1993 | Defendini et al. | 204/192.29 |
| 5,327,281 | 7/1994 | Cogan et al. | 359/270 |
| 5,384,076 | 1/1995 | Sato et al. | 252/518 |

FOREIGN PATENT DOCUMENTS

| | | |
|---|---|---|
| 0098416 | 12/1992 | European Pat. Off. |
| 3-42634 | 2/1991 | Japan. |
| 4-107427 | 4/1992 | Japan. |
| 4-306614 | 10/1992 | Japan. |
| 4-318525 | 11/1992 | Japan. |

OTHER PUBLICATIONS

J. J. Bessot, New Vacuum Deposition Techniques, *Metal Finishing*, Mar., 1980, pp. 21–26.

R. V. Stuart, *Vacuum Techlology, Thin Films, and Sputtering—An Introduction*, Academic Press, New York, 1983, pp. 123–131.

Cogan et al, *SPIE*, vol. 823, No. 482 (1987), "The a–WO$_3$/a–IrO$_2$ Electrochromic System".

Kang et al, *J. Electrochem Soc.*, vol. 130, No. 4, pp. 766–769, (Apr. 1983), "Blue Sputtered Iridum Oxide Films (Blue SIROF's)".

Rauh et al, *Solid State Ionics*, 28–30 (1988) pp. 1707–1714, "Counter Electrodes in Transmissive Electrochromic Light Modulators".

Hackwood et al, *Journal of the Electrochemical Soc.*, vol. 128, No. 6, pp. 1212–1214, (Jun. 1981), "Volume Changes Induced by the Electrochromic Process in Sputtered Iridium Oxide Films".

*Primary Examiner*—Paul Lieberman
*Assistant Examiner*—M. Kopec
*Attorney, Agent, or Firm*—Irwin M. Stein

[57] ABSTRACT

A method of depositing a nitrogen-containing electrochromic iridium oxide film by sputtering iridium in an atmosphere comprising oxygen and nitrogen is disclosed for use in producing a transparent electrochromic article. The article includes electroconductive films, e.g., ITO, on two substrates, one of which has a superimposed electrochromic film, e.g., tungsten oxide, and the other of which has superimposed the iridium oxide film of the invention. An ion conductive layer between the electrochromic films completes the article.

4 Claims, No Drawings

IRIDIUM OXIDE FILM FOR ELECTROCHROMIC DEVICE

CROSS REFERENCE TO RELATED APPLICATION

This application is a continuation-in-part application of U.S. application Ser. No. 08/267,724 filed Jun. 28, 1994, which is a continuation-in-part application of application Ser. No. 08/152,339 filed Nov. 12, 1993, now abandoned.

BACKGROUND OF THE INVENTION

This invention relates generally to the art of electrochromic cells, and more particularly relates to the art of transparent electrochromic devices utilizing iridium oxide as a complementary electrochromic film and as the charge-balancing counter electrode.

Conventional electrochromic cells comprise a thin film of a persistent electrochromic material, i.e., a material responsive to the application of an electric field of a given polarity and sufficient voltage to change from a high-transmittance, non-absorbing state to a lower-transmittance, absorbing or reflecting state. The film of electrochromic material remains substantially in the lower-transmittance state after the electric field is discontinued. When an electric field of opposite polarity is applied to the electrochromic material, it returns to the prior high-transmittance state. The film of electrochromic material, which is both an ionic and electronic conductor, is in ion-conductive contact, preferably direct physical contact, with a layer of ion-conductive material. The ion-conductive material may be a solid, liquid or gel. The electrochromic film and ion-conductive layer are disposed between two electrodes to form a cell. In some applications, a complementary electrochromic film is used to form a cell, while in other applications an optically passive film or metal is used in place of the complementary electrochromic film to form the cell.

As voltage is applied across the two electrodes, ions are conducted through the ion-conducting layer. When the electrode adjacent to the film of electrochromic material is the cathode, and the electrochromic material is cathodically coloring, application of an electric field to that material causes darkening of the film. Reversing the polarity of the electric field causes reversal of the electrochromic properties, and the film reverts to its high transmittance state. Conventionally, a cathodically coloring electrochromic material, usually tungsten oxide or compounds thereof, is deposited on a glass substrate that has been previously coated with an electroconductive film such as tin oxide or indium/tin oxide (ITO) to form one electrode. In some electrochromic devices, the counter electrode has been a carbon-paper structure backed by a similar tin oxide or indium/tin oxide coated glass substrate or metal plate.

Schiavone describes the deposition of electrochromic iridium oxide by reactive sputtering of an iridium target in the Journal of the Electrochemical Society, Vol. 128 No. 6 pp. 1212–1214 (June 1981). Iridium oxide films are deposited by reactive radio frequency sputtering of an iridium target in pure oxygen to deposit a film in the fully colored state.

Kang and Shay describe blue sputtered iridium oxide films in the Journal of the Electrochemical Society, Vol. 130, No. 4, pp. 766 et seq. (April 1983). The properties are compared with those of black sputtered iridium oxide films and the properties of anodically grown iridium oxide films. The blue iridium oxide films are deposited by reactive direct current sputtering of iridium in a 80/20 argon/oxygen gas mixture onto glass substrates held at 238° K. The process used by the authors include target pre-sputtering for 15 minutes in pure argon followed by 25 minutes of in-situ substrate cleaning and another pre-sputtering step for 10 minutes in the argon/oxygen gas mixture used for the actual coating. As electrochromic display electrodes, the blue sputtered iridium oxide films are described as having an improved open-circuit bleached state and written-state memory, as well as an improved appearance.

Cogan et al describe electrochromic devices in SPIE, Vol. 823, No. 482 et seq. (1987) comprising indium/tin oxide (ITO) coated glass sheets, electrochromic films of tungsten oxide and iridium oxide, and a polymer electrolyte of poly-2-acrylamido- 2-methylpropane-sulfonic acid (polyAMPS).

U.S. Pat. No. 4,350,414 to Takahashi et al discloses a solid state electrochromic device comprising a pair of electrodes, an oxidizable film of iridium hydroxide and/or nickel hydroxide, a reducible film of tungsten oxide and/or molybdenum oxide, and an insulating film between said films that allows proton conduction, but prohibits electron conduction, e.g., tantalum oxide, zirconium oxide, niobium oxide, alumina, magnesium fluoride, silicon oxide, titanium oxide, hafnium oxide or yttrium oxide.

U.S. Pat. No. 5,327,281 to Cogan et al describes a solid polymer electrolyte for an electrochromic device which is laminated between an amorphous tungsten trioxide coated indium/tin oxide coated glass substrate and an iridium oxide coated indium/tin oxide coated glass substrate.

DESCRIPTION OF THE INVENTION

The present invention is directed to a nitrogen-containing iridium oxide film. More particularly, the present invention is directed to an electrochromically active nitrogen-containing iridium oxide films for use in transparent and non-transparent electrochromic devices. The film may be deposited by sputtering an iridium target within a sputtering chamber containing a substrate on which the film is deposited under conditions such that nitrogen in the oxygen-containing reactive gas is incorporated into the iridium oxide. No special measures are required for the deposition process, such as the maintenance of low temperatures or extensive preconditioning of the iridium sputtering target. Iridium oxide films containing nitrogen have been found to exhibit desirable properties when utilized as a complementary electrochromic film in a solid-state electrochromic device. When nitrogen-containing iridium oxide films are electrochemically precharged (reduced), such films are observed to be more stable than iridium oxide films that do not contain nitrogen, as evidenced by the low change in transmittance after application of the electric field, i.e., upon exposure to ambient conditions, no self darkening of the film is observed after application of the electric field. Such films are thus resistant to oxidation when exposed to air. Moreover, high deposition rates of 100 Angstroms/minute for nitrogen-containing iridium oxide films have been obtained.

The substrate for the iridium oxide film of the present invention is in one embodiment a light transmitting material, particularly a transparent material such as glass or plastic, preferably a transparent material suitable for producing lenses used in eyewear, such as polymer lenses prepared from synthetic optical resins. The polymer lens may have a conventional refractive index (about 1.48–1.5), a relatively high refractive index (about 1.60–1.75), or a mid-range refractive index (about 1.55–1.56), depending on the end use; or the polymer lens may have a refractive index anywhere between about 1.48 and about 1.75, e.g., from about 1.50 to 1.66.

Synthetic polymer substrates that may be used as a lens material include, but are not limited to: thermoplastic polycarbonates, such as the carbonate-linked resin derived from Bisphenol A and phosgene, which is sold under the trademark LEXAN; polyesters, such as the material sold under the trademark, MYLAR; poly(methyl methacrylates), such as the material sold under the trademark, PLEXIGLASS; and polymerizates of a polyol(allyl carbonate) monomer, especially diethylene glycol bis(allyl carbonate), which is sold under the trademark CR-39. Copolymers of the aforedescribed monomers/resins may also be used as a lens material. Further, these and other transparent and non-transparent polymeric substrates known in the art for use for various optical and non-optical applications may be used as a substrate for the nitrogen-containing iridium oxide film.

The substrate on which the iridium oxide film is deposited, e.g., a transparent substrate, is generally not electrically conductive. When preparing an electrochromic device, the substrate is preferably first coated with an electroconductive film. The electroconductive film may be any of those known in the art that are used as electroconductive films in electrochromic devices. Such films are typically transparent thin films of metal or metal oxide, e.g., fluorine-doped tin oxide or tin-doped indium oxide, commonly referred to as ITO (indium/tin oxide), preferably ITO comprising a weight ratio of about 90:10 indium to tin. Other materials such as antimony-doped tin oxide and aluminium-doped zinc oxide may also be used as the electroconductive film. The film preferably has a sheet resistance in the range of 10 to 30 ohms per square. The electroconductive film thickness is preferably in the range of 1300 to 4000, e.g., 2000 to 4000, Angstroms, more preferably in the range of 2500 to 2800 Angstroms, and preferably, the film has a sheet resistance of about 18 to 30 ohms per square for desired electrical conductivity.

The electroconductive film may be deposited by a variety of methods known in the art so long as the substrate is not deleteriously affected by such method. High temperature pyrolyric methods may be used to deposit electroconductive films on glass, but such methods generally are not suitable for lower melting polymeric substrates. A preferred method for depositing the electroconductive film, such as ITO, on polymeric substrates is direct current (DC) sputtering, particularly DC magnetron reactive sputtering (MSVD), such as the MetaMode® sputtering system, which is a high deposition rate, low temperature process that is described in U.S. Pat. Nos. 4,851,095 and 5,225,057, and copending U.S. patent application Ser. No. 08/293,129 filed Aug. 19, 1994, the disclosures of which are incorporated herein by reference. Vacuum web coating with a chilled drum is another method of coating ITO on plastic substrates.

In the aforesaid '095 and '057 patents, the substrate to be coated is rotated alternately through a high rate metallic sputtering zone and an energetic reactive plasma. The DC magnetron sputtering cathodes operate in a partial pressure separation regime in combination with a rotary cylindrical workpiece transport system. Using such techniques, ITO films having a visible transmittance of greater than 80% and a sheet resistance of 18–20 ohms/square may be prepared at 20° C.

The adhesion of electroconductive metal oxide films to plastic substrates is generally not adequate for environmental durability and long-term cycling (coloring/bleaching cycles) of electrochromic devices. In such cases, an adhesion improving polymeric primer is preferably disposed at the interface of the substrate and the electroconductive film to improve the adhesion of the electroconductive film to the surface of the plastic substrate. In addition, the polymeric primer aids in preventing crazing and/or cracking of the plastic substrate and the electroconductive film. A preferred primer for polymeric substrates prepared from an optical resin comprising CR-39® allyl diglycol carbonate monomer is an acrylate copolymer, preferably a copolymer of acrylic acid and a substituted acrylate, such as cyanoethylacrylate, hydroxyethylacrylate, methyl methacrylate and mixtures of such substituted acrylates. Preferably the substituted acrylate is methyl methacrylate, and the molar ratio of acrylic acid to the substituted acrylate, e.g., methyl methacrylate is from about 3 to 1 to about 1 to 3.

The primer is preferably applied to the plastic substrate surface as a solution of monomers in an organic solvent by dip, flow or other conventional application techniques. The organic solvent is then evaporated and the polymeric primer cured at slightly elevated temperatures, typically about 180° to 200° F. (about 80° to 92° C.) for about 8 hours. The monomer solution will generally include an initiating amount of a free-radical initiator, such as azobisisobutyronitrile. The monomer solution may also contain cycloaliphatic diepoxides for cross-linking the acrylate copolymer. Diepoxides that may be mentioned include 2-[3,4-epoxy cyclohexyl-5,5-spiro-3,4-epoxy]cyclohexane-metadioxane; bis[3, 4-epoxycyclohexyl]adipate; and 3,4-epoxycyclohexyl-3,4-epoxy-cyclohexane-carboxylate. The monomer solution preferably includes also a catalyst, such as dibutyltindilaurate (DBTDL) or uranyl nitrate, to cure the primer.

The organic solvent used for the monomer solution may be cyclohexanone, 1-propanol, 1-butanol, acetone, and mixtures of such solvents. A preferred organic solvent is 1-propanol. A method of applying the primer is to dip the plastic substrate into the primer monomer solution, remove the substrate from the solution, and dry and cure the coating of primer on the substrate. Subsequently, the primer is polished off the surface not coated with an electroconductive film. Another method of applying the primer to the plastic substrate is to spin coat the monomer solution onto one surface of the substrate, and dry and cure the resulting primer coating. The thickness of the primer coating is preferably in the range of about 0.01 to 0.50 microns, more preferably about 0.29 to 0.46 microns.

Two primed and electroconductive film coated transparent plastic substrates are paired to prepare a transparent electrochromic device. An electrochromic film is deposited on the electroconductive film of one plastic substrate and a complementary electrochromic film is deposited on the electroconductive film of the other plastic substrate. Of the various known electrochromic materials, such as the oxides of molybdenum ($MoO_3$), tungsten ($WO_3$), vanadium ($V_2O_5$), niobium ($Nb_2O_5$), titanium ($TiO_2$), chromium ($Cr_2O_3$), praseodymium ($PrO_2$), and ruthenium ($RuO_2$), tungsten oxide and compounds of tungsten oxide are preferred. In addition, ternary metal oxides and tungsten bronzes, such as $MoWO_3$, $NbWO_3$, $K_{1-x}WO_3$ and $Na_{1-x}WO_3$, wherein x is less than 1 may be used.

Tungsten oxide may be deposited on a substrate by thermal evaporation of tungsten oxide, but is preferably deposited by direct current (DC) magnetron sputtering of tungsten in a rare gas/oxygen atmosphere at high total gas pressures (exceeding 20 milliTorr) utilizing equipment such as the MetaMode® system described in U.S. Pat. Nos.

4,851,095 and 5,225,057. The thickness of the electrochromic, e.g., tungsten oxide, film is preferably in the range of 3000 to 5000 Angstroms, more preferably about 3700 ±500 Angstroms. The electrochromic film, e.g., tungsten oxide, is in the clear (high transmittance) state as deposited.

In accordance with an embodiment of the present invention, the other primed and electroconductive film coated substrate is further coated over the electroconductive film with a film of nitrogen-containing iridium oxide. The iridium oxide film may be deposited by radio frequency (rf) or direct current (DC) magnetron sputtering. The sputtering gas comprises oxygen, nitrogen (or a nitrogen-containing gas) and an inert gas such as argon, neon, krypton or xenon. Argon is preferred as the inert gas for reasons of cost. The nitrogen partial pressure is preferably equal to or greater than the inert gas, e.g., argon, partial pressure. In addition, high partial pressures of oxygen in the system are used. Preferably, the oxygen partial pressure is 20 to 50 percent of the total gas pressure. The flow rate of oxygen to nitrogen is preferably from about 2–8:1, e.g., 4–7:1. It has been found that the amount of nitrogen in the iridium oxide film increases with an increase in the relative amount of oxygen, vis-a-vis, inert gas, e.g., argon.

As with the electrochromic film, the nitrogen-containing iridium oxide complementary electrochromic film may be deposited using the MetaMode® system, which includes a DC magnetron reactive sputter deposition system where the reactive gas is separated from the non-reactive gas by a low pressure region. The deposition of metal species takes place on a substrate that translates and/or rotates between the sputtering target deposition region and the reactive gas plasma region. The reactive gas region consists of a positively biased electrode so that an intense plasma of reactive ion species is formed and the ions bombard the freshly deposited metal on a substrate thereby forming compounds of the metal, such as oxides, nitrides, oxynitrides, or combinations thereof. The system may be described simply as sequential deposition-reaction-deposition-reaction, etc. until the desired film thickness is obtained.

Total system gas pressures within the system are in the range of 5–100, e.g., 40–75, milliTorr. Reactive gas partial pressures within the system are in the range of 7–40 milliTorr. The nitrogen or nitrogen-containing gas may be introduced at any suitable location in the MetaMode® system, e.g., the deposition zone, the reaction zone or any inactive deposition zone. Typical cathode power and ion source current are within the ranges of 1–5 kilowatts and 1–3 amperes respectively. Optimum conditions may be determined through a statistically design of experiment for nitrogen-containing iridium oxide films.

Sputtering of iridium oxide is accomplished using an iridium target of a size and shape appropriate for the size and shape of the substrates to be coated, and spaced a suitable distance, e.g., 3–6 inches (7.62–15.24 centimeters) from, but in close association with, the substrate to deposit a uniform coating. The sputtering chamber is preferably evacuated to a pressure less than $10^{-5}$, preferably less than $10^{-6}$, Torr before introducing the reactive gas composition of the sputtering atmosphere. The deposition of nitrogen-containing iridium oxide is performed by sputtering the iridium target and contacting the sputtered iridium with a reactive gas, i.e., in an oxidizing atmosphere, preferably comprising oxygen and a nitrogen-containing gas, at a chamber pressure in the range of about 5–100, e.g., 40–75 milliTorr, depending on the particular sputtering equipment used.

It has been found in accordance with the present invention that when nitrogen is present in the iridium oxide film, the film is more stable against a loss in transmittance when electrochemically reduced and then exposed to air, e.g., there is a minimum amount of self-darkening or bleaching over a short period of time, e.g., 30 minutes. Stated differently, the nitrogen-containing iridium oxide film exhibits significant improvement in retaining a high bleach state optical transmittance. In addition, it has been found that when the nitrogen-containing iridium oxide film is electrochemically reduced, it does not again oxidize when exposed to air.

The reactive gas atmosphere in the sputtering chamber contains a sufficient amount of nitrogen to result in the incorporation of a stabilizing amount of nitrogen in the iridium oxide film, i.e., sufficient nitrogen to prevent a significant change in transmittance after the film is electrochemically precharged. Stated differently, the amount of nitrogen incorporated into the iridium oxide film is sufficient to stabilize the film such that its transmittance is not significantly altered during electrochemical reduction. Nitrogen in the sputtering chamber atmosphere may be introduced either as pure nitrogen gas or in the form of air or other nitrogen-containing gas compositions, for example ammonia. The nitrogen source may be charged separately and continuously to the chamber or as part of the oxygen source that provides the oxidizing atmosphere.

The iridium oxide film as deposited preferably comprises at least 2 atomic percent, more preferably at least 5, most preferably at least 8 atomic percent nitrogen. Iridium oxide films contemplated herein contain from about 2 to 20, e.g., 4 or 8 to 18, or 12 to 18 atomic percent nitrogen, although films containing greater than 20 atomic percent nitrogen are contemplated. The thickness of the nitrogen-containing iridium oxide film is preferably in the range of about 300 to 800 Angstroms. Such films may be analyzed by Rutherford Backscatter Spectrometry (RBS), which provides analytical results as atomic number density (atoms/cm$^2$) and which is referred to herein as atomic percent. In one embodiment, the films have been found to comprise 66 to 68 atomic percent oxygen and 4 to 12 atomic percent nitrogen, the ratio of atomic oxygen to iridium being in the range of about 2 to 3.

The amount of nitrogen incorporated in the iridium oxide film can be controlled by varying the nitrogen flow rate (or partial pressure) while other process conditions are kept the same. Another way of controlling the amount of nitrogen incorporated into the film is by varying the relative oxygen to inert gas, e.g., argon, flow rate ratio at a constant nitrogen flow rate. At present, the precise chemical nature of the nitrogen in the iridium oxide film has not been established. It is postulated that the nitrogen is present as elemental nitrogen, or some form of a nitride or oxynitride.

The amount of nitrogen in the iridium oxide film has been found to affect the electrochromic characteristics of the film. The switching speed, the coloring efficiency (defined as the change in optical density per charge density), the charge capacity, and the range of coloring/bleaching are all found to vary depending on the level of atomic nitrogen incorporated in the film.

When radio frequency (rf) magnetron sputtering is used to deposit the iridium oxide film, the power is also selected with regard to the sputtering equipment, and may be in the range of 100 to 135 watts, more preferably about 125 watts, for a target size of about 42 square centimeters during the deposition period. Power density is preferably in the range of 1 to 5, more preferably 2 to 4, most preferably 2.5 to 3.5, watts per square centimeter. The target and chamber are usually water cooled throughout the rf magnetron sputtering coating deposition process. In the MetaMode® system, the target alone is usually water cooled.

The nitrogen-containing iridium oxide film coated on the ITO coated substrate may be electrochemically pre-charged in an acid bath, such as 0.1 Molar hydrochloric acid or 0.1 Molar sulfuric acid, using either galvanostatic or potentiostatic techniques. In one embodiment, the cell configuration has three electrodes; namely a working electrode (WE), a reference electrode (RE), and a counter-electrode (CE). The working electrode is the nitrogen-containing iridium oxide film; the reference electrode is a standard calomel electrode (SCE); and the counter-electrode is platinum foil having an area of 25 square centimeters.

Using potentiostatic conditions with an applied voltage in the range of from −0.5 to −0.1 volts versus a standard calomel electrode, the amount of charge inserted and removed is about 13–40 mC/cm$^2$.

The electrochemical reduction has been conducted also under galvanostatic conditions including an applied current of about $1.5 \times 10^{-3}$ amperes and a voltage limit set at 1.5 volts. The amount of charge inserted and removed under these conditions is about 23 millicoulombs per square centimeter (mC/cm$^2$). A coulometer wired in series to the WE can be used to measure the charge. The accumulated charge may be in the range of about 1 to 40, preferably 15 to 29, more preferably 20 to 29, millicoulombs per square centimeter.

After the two plastic substrates have been primed, coated with electroconductive film and further coated with an electrochromic film, the pair are assembled to form a cell with the electrochromic films in a face to face relationship. The cell may be produced by preferably disposing a preformed sheet of an ion-conducting polymer between the two half cells and laminating the resultant assembly in an autoclave. The layer of ion-conducting material, preferably an ion-conducting polymer, bonds with both electrochromic surfaces to form a laminated article. In accordance with a preferred embodiment of the present invention, the ion-conducting polymer electrolyte is a proton-conducting polymer. Homopolymers of 2-acrylamido-2-methylpropane-sulfonic acid (AMPS®—a registered trademark of Lubrizol) and copolymers of AMPS with various monomers may be utilized in the form of preformed sheets which are laminated between the substrates, or in the form of a liquid reaction mixtures of monomers which are cast and cured in place. A preferred proton-conducting polymer electrolyte in accordance with the present invention is a copolymer of AMPS and N,N-dimethylacrylamide (DMA), preferably cast and cured in place. Preferred copolymers of AMPS and DMA are prepared from AMPS and DMA monomers in a molar ratio range of about 1:3 to 1:2. The thickness of the polymer electrolyte is preferably in the range of 0.001 to 0.025 inch (0.0254 to 0.625 millimeter), more preferably 0.005 to 0.015 inch (0.127 to 0.381 millimeter), as described in U.S. application Ser. No. 08/152,340 filed Nov. 12, 1993, the disclosure of which is incorporated herein by reference.

The AMPS/DMA copolymer proton-conductive electrolyte is preferably cast in place as a solution of monomers in 1-methyl-2-pyrrolidinone (NMP) and water. The monomer solution comprises a photoinitiator to polymerize the monomers upon exposure to actinic radiation, preferably ultraviolet (UV) light. Preferred UV initiators include benzoin methyl ether and diethoxyacetophenone. The monomer solution may be poured between two separate electroconductive and electrochromic coated polymer lens substrates assembled together with a 0.005 to 0.025 inch (0.381 to 0.508 millimeter) TEFLON® spacer held in place with a commercially available sealant, e.g. Torr Seal® from Varian Vacuum Products. Curved lenses are typically about 70 millimeters in diameter and 1 to 2 millimeters thick. For a pair of curved lens substrates, the monomer solution may be poured onto the concave surface of one lens substrate and the convex surface of the other lens substrate placed in contact with the monomer solution, thus forming the monomer solution into a thin film between the lens substrates. Exposure to UV light sufficient to cure the polymer electrolyte is typically about 30 minutes for a mercury lamp and about one to 3 minutes for a xenon lamp. While the aforesaid discussion is directed to curved substrates, the nitrogen-containing iridium oxide film of the present invention may also be applied to flat substrates for use in applications other than lenses.

In addition to the above-described ion-conducting polymer electrolytes, other materials, as for example materials comprising hydrogen uranyl phosphate or polyethylene oxide/LiClO$_4$, may also be employed. Also, inorganic films such as LiNbO$_3$, LiBO$_3$, LiTaO$_3$, LiF, Ta$_2$O$_5$, Na$_2$AlF$_6$, Sb$_2$O$_5$.nH$_2$O +Sb$_2$O$_3$, Na$_2$O.11Al$_2$O$_3$, MgF$_2$, ZrO$_2$, Nb$_2$O$_5$ and Al$_2$O$_3$ are contemplated for use as the electrolyte material.

The resultant electrochromic lens is generally crack-free with insignificant haze (0.3 to 0.4%). The electrical connections to the electrochromic device are preferably made with electrically conductive bus bars. The optical transmittance of the lens at 550 nanometers is typically about 75 percent or higher in the bleached state and has a minimum of about 10 percent in the darkened state in the voltage range of from about +1.5 to −1.5 volts for a charge in the range of about 23 to 29 millicoulombs per square centimeter (mC/cm$^2$). The charge capacity of such films may range from less than 3 to more than 30 millicoulombs per square centimeter. For electrochromic articles other than eyewear, the transmittance in the bleached state may be lower and in the darkened state may be higher or lower.

The present invention is more particularly described in the following examples which are intended as illustrative only since numerous modifications and variations therein will be apparent to those skilled in the art.

EXAMPLE I

The surface of a 70 millimeter diameter, 6 plano, 2 millimeter thick polymeric lens substrate, made from CR-39® monomer (PPG Industries, Inc.),was primed with a polymeric primer consisting of a copolymer of acrylic acid and methylmethacrylate (3:1 mole ratio). The primed surface was then coated by DC sputtering at 140° F. (60° C.) in an atmosphere of 80 percent argon and 20 percent oxygen from a target of 90 weight percent indium and 10 weight percent tin to deposit an electroconductive layer of indium/tin oxide (ITO) about 2600 to 2800 Angstroms thick. Finally, a thin film of nitrogen-containing iridium oxide was deposited by radio frequency (rf) magnetron sputtering onto the primed and electroconductively coated surface. The base pressure for sputter coating was $2 \times 10^{-5}$ Torr. The iridium oxide deposition took place in a nitrogen-containing oxygen atmosphere, where the total coating pressure was $25 \times 10^{-3}$ Torr. The target was iridium metal, 99.9 percent purity, with a target size of 2.87 inches (7.3 centimeters) in diameter. The distance from the target to the substrate was six inches (15.24 centimeters). The rf power was 125 watts, power density of 3 watts per square centimeter, for a duration of 44 minutes. Typical sputtering rates were 9 to 15 Angstroms per minute. The nitrogen-containing iridium oxide film thickness was about 600 Angstroms.

The coated sample was analyzed for optical transmittance in the visible region. The coating was then electrochemically precharged in a bath of 0.1N hydrochloric acid (HCl) at a constant current of $1.5\times10^{-3}$ amperes at a voltage limit of 1.5 volts (V). The amount of charge inserted and removed was about 21 millicoulombs per square centimeter (mC/cm$^2$). Following this galvanostatic treatment, the optical transmittance and coating adhesion were measured. Nitrogen-containing iridium oxide film as deposited had a photopic transmittance of about 40 percent. Charging the films with 21 mC/cm$^2$ resulted in a photopic transmittance of about 75 percent after three electrochemical oxidation/reduction cycles. Charge retention of the film was excellent. After 30 minutes exposure to air, the change in transmittance was only 1 percent in the photopic region, compared with 5 to 8 percent for iridium oxide film deposited without nitrogen. The adhesion of the film following precharging passed the cross hatch test, ASTM D3359 Method A, with a 5 rating. Electrochemical experiments demonstrated good reversibility of protons into and out of the iridium oxide lattice; charge exchange was approximately 23 mC/cm$^2$. Cyclic voltammograms (CV) of the nitrogen-containing iridium oxide film showed good stability after repetitive cycling.

The iridium oxide coated lens was then laminated with a tungsten oxide coated lens comprising a polymer substrate made from CR-39® monomer, the aforementioned primer and ITO layers as previously described, and a tungsten oxide film about 3700±500 Angstroms thick, utilizing as the ion-conducting layer a 0.020 inch (0.51 millimeter) thick layer of copolymer of AMPS/DMA prepared from a reaction mixture comprising by weight 28 percent AMPS, 47 percent DMA, 6 percent 1-methyl-2-pyrrolidinone (NMP) and 19 percent water. The electrochromic article exhibited a bleached state transmittance of 76 percent and a darkened state transmittance of 25 percent as measured with a Spectrogard Color System Model 96 spectrophotometer.

EXAMPLE II

A nitrogen-containing film of iridium oxide was deposited on a plastic substrate prepared from a resin composition comprising CR-39® allyl diglycol carbonate monomer using the DC magnetron sputtering system described in U.S. Pat. Nos. 4,851,095 and 5,225,057. An iridium metal target of 2.75×5.25×0.25 inches (32.39×13.34×0.64 centimeters) was used. The substrate had an area of 25 square centimeters. The deposition process conditions used were as follows:

Cathode power: 1 Kwatt

Sputtering gas: Argon @100sccm

Ion source current: 1 Ampere

Reaction Gas: Oxygen @850 sccm

Nitrogen Gas Flow: 110 sccm

Total Gas Pressure: 40 mTorr

Drum Diameter: 34 inches (86.3 cm)

Drum Rotation: 100 rpm

Target-to-Substrate Distance: 3 inches (7.6 cm)

Iridium Oxide Film Thickness: 600 Angstroms

Deposition Rate: 100 Angstroms/min (sccm=standard cubic centimeters/minute)

The iridium oxide film was analyzed for nitrogen using Rutherford Backscatter Spectrometry and found to contain 8% atomic nitrogen. The 600 Angstrom film had a transmittance of 40% in the as deposited condition. The film was electrochemically reduced in 0.1M (Molar) hydrochloric acid using a three electrode potentiostatic technique. A −0.5 V versus the saturated calomel reference electrode was applied to the sample (working electrode). A 25 square centimeter platinum foil was used as a counter-electrode. The amount of charge injected was 750 millicoulombs (30 millicoulombs/cm$^2$). The charge was then extracted by applying a +1.0 V (vs SCE). This process was repeated 3 to 5 cycles before the sample was removed from the acid solution. The bleached transmittance of the sample was 70%.

The amount of charge injected into such samples may be varied by controlling the potentiostat. Charge levels of from about 23 to about 40 mC/cm$^2$ have been obtained in such a manner.

EXAMPLE III

Using the DC magnetron sputtering unit described in Example II, iridium oxide films were deposited on 4 cm$^2$ glass squares that had an ITO electroconductive coating having a sheet resistance of 5 ohms per square. The nitrogen gas flow was maintained constant at 220 sccm, while the oxygen and argon flow rates were varied. The combined total flow rate for the oxygen and argon gases was kept at 950 sccm. The total gas pressure was maintained at 40 mTorr by carefully regulating the conductance to the high vacuum pumps, which are used to adjust the total gas pressure. Films prepared with the gas flow rates described in Table I were analyzed for nitrogen by RBS and the results reported in Table I.

TABLE I

| Film | O$_2$ Flow Rate[a] | N$_2$ Flow Rate[a] | % N in Film | % T[b] Loss (5 min) |
|---|---|---|---|---|
| 1 | 600 | 220 | 5.0 | 3.8 |
| 2 | 800 | 220 | 8.0 | 2.0 |
| 3 | 850 | 220 | 9.0 | 1.7 |
| 4 | 890 | 220 | 11 | 0 |

[a]sccm (std cubic cm/min)
[b]Transmittance

The data of Table I show that the amount of nitrogen incorporated into the iridium oxide film increased from 5% to 11% as the flow rate of oxygen increased compared to the flow rate of argon.

The above examples are offered to illustrate the present invention without limiting its scope. Various other materials and process conditions not specifically described will be apparent to those skilled in the art. For example, the counterelectrode may also be passive, instead of complementary, utilizing material such as In$_2$O$_3$, fluorine-doped tin oxide, tin-doped indium oxide (ITO) and Nb$_2$O$_5$. Organic electrochromic materials such as polyanilene and viologens (1,1-diheptyl-4, 4-bipyridinium dibromide) may also be used in the electrochromic devices of the present invention.

Although the present invention has been described with reference to specific details of certain embodiments thereof, it is not intended that such details should be regarded as limitations upon the scope of the invention except as and to the extent that they are included in the accompanying claims.

We claim:

1. An electrochromically active iridium oxide film comprising iridium oxide, wherein said iridium oxide film has incorporated therein an amount of nitrogen which is sufficient to prevent a significant change in transmittance after the film is electrochemically precharged.

2. An electrochromically active iridium oxide film comprising iridium oxide and about 2 to 20 atomic percent.

3. The film of claim 2 wherein the amount of nitrogen is from about 8 to 18 atomic percent.

4. The film of claim 2 wherein the iridium oxide film comprises from about 66 to 68 atomic percent oxygen, 4 to 12 atomic percent nitrogen, and wherein the ratio of atomic oxygen to iridium is in the range of about 2 to 3.

* * * * *